METHOD OF FORMING SOLDER MOUNDS ON SUBSTRATES

Filed Jan. 20, 1966

INVENTORS.
JOHN NAPIER
RAEMAN P. SOPHER
PAUL A. TOTTA
DAVID DeWITT
CLARENCE KARAN

BY Sughrue, Rothwell, Mion, Zinn & Macpeak
ATTORNEYS 3,458,925
METHOD OF FORMING SOLDER MOUNDS ON SUBSTRATES John Napier, Poughquag, and Raeman P. Sopher, Paul A. Totta, David De Witt, and Clarence Karan, Poughkeepsie, N.Y., assignors to International Business Machines Corporation, Armonk, N.Y., a corporation of New York Filed Jan. 20, 1966, Ser. No. 521,988
Int. Cl. B01j *17/00;* B23k *31/02*
U.S. Cl. 29—578 6 Claims

ABSTRACT OF THE DISCLOSURE

A method of forming mounds of solder on integrated circuit chips having lands thereon comprising masking the surface of the chips so as to expose only the land and area immediately thereround, evaporating a layer of solder in the mask and subsequently heating the solder above its melting point whereby the solder de-wets the area around the lands and contracts to form solder mounds on the lands.

This invention relates to a novel method of forming convex mounds of solder of desired dimensions on inorganic, electrically insulating substrates, such as micro-miniaturized integrated circuit chips, which mounds may serve active or passive functions when the chips are ultimately attached to a mounting board.

In the fabrication of integrated circuit chips as practiced in the prior art, small copper balls have been attached to the chips at various points to serve as active electrical contacts when the chips are subsequently attached to a mounting board. Passive standoffs to provide the proper spacing between the chips and the mounting board usually take the form of small glass or ceramic beads. The balls are generally bonded to the chips by solder connections between the balls and metallic ball limiting lands, the latter comprising circular metal laminates, such as chromium, copper and gold. It has been recognized that the copper balls and glass standoffs could be replaced by individual mounds of solder with a substantial savings in cost and simplification of the fabrication procedure, but prior to this invention no practical method was known by which such solder mounds could be formed with the very close dimensional tolerance required.

It is therefore a primary object of this invention to provide a method for forming solder mounds of desired dimensions on the surfaces of inorganic, electrically insulating substrates, such as glass or ceramic like integrated circuit chips.

It is a further object of this invention to provide such a method which provides consistently reliable results and which is relatively easy to implement from a manufacturing standpoint.

These and further objects and advantages of this invention are realized by aligning a metal mask over the circuit chip having holes in its corresponding to the positions of the existing ball limiting lands on the chip and concentric therewith. The holes generally have larger diameters than the lands. A layer of solder or other low melting point alloy is then evaporated onto the lands and the exposed surfaces of the chip surrounding the lands through the mask holes. Following this the mask is removed and the chip is heated under flux, or in a reducing atmosphere to re-melt the solder. As the circles of solder melt, they de-wet the ceramic surface of the chip and draw up into the desired mounds on top of the ball limiting lands. This is due to the well known phenomenon that molten metals with high surface tensions de-wet ceramics and glasses.

Figure 1:
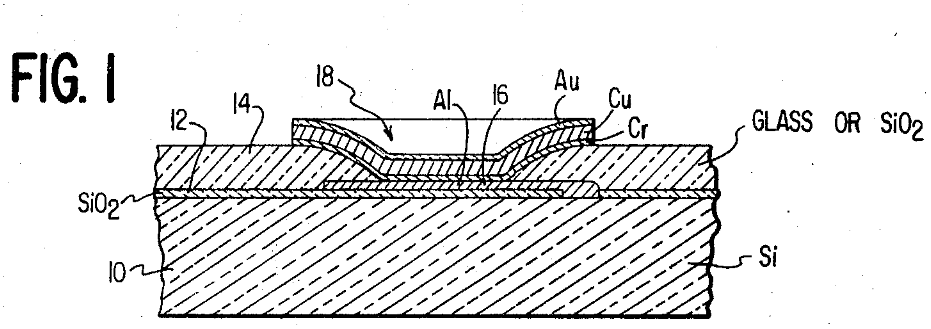
Figure 2:
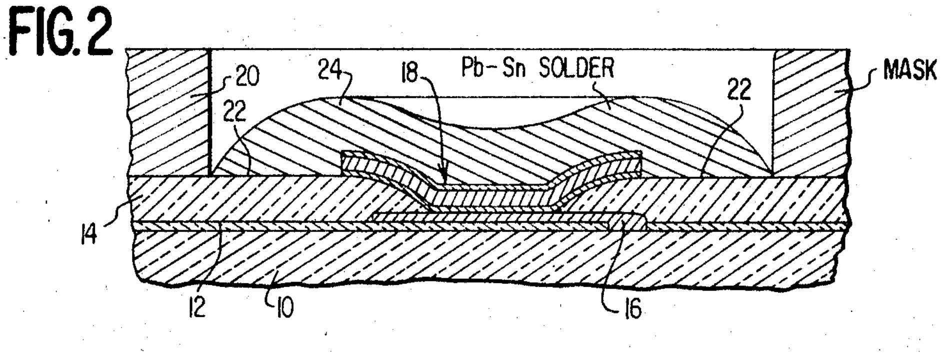
Figure 3:
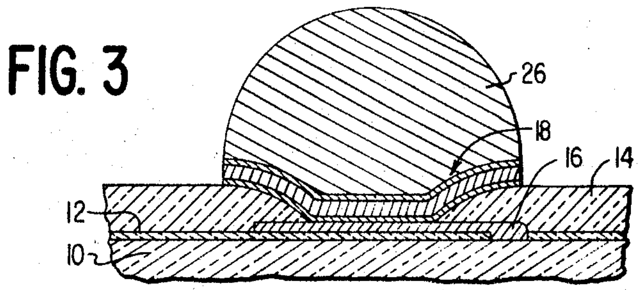

The foregoing and other objects, features and advantages of the invenion will be apparent from the following more particular description of preferred embodiments of the invention, as illustrated in the accompanying drawings, in which:

FIGURE 1 shows a cut-away side view of an integrated circuit chip with a ball limiting land formed on one surface thereof, FIGURE 2 shows the same land and chip after a layer of solder has been evaporated thereon through a metal mask, FIGURE 3 shows the finished solder mound after the originally evaporated layer has been re-melted to de-wet the ceramic.

Figure 4A:
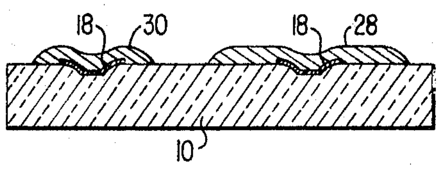
Figure 4B:
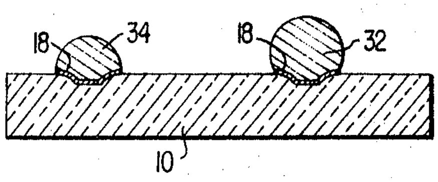
Figure 5:
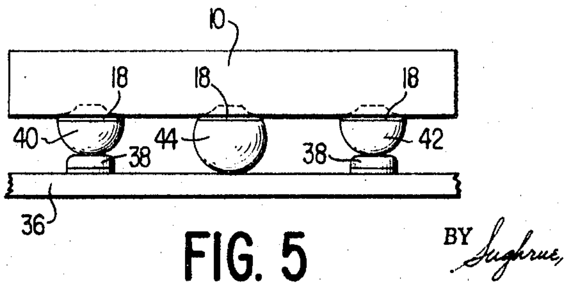

FIGURES 4*a* and 4*b* illustrate how different sized solder mounds can be formed by controlling the diameters of the evaporated solder circles, and FIGURE 5 shows a circuit chip provided with both active and passive solder mounds assembled to a mounting board.

Referring now to the drawing, which the same reference numerals have been used throughout the various figures to designate like structure elements, FIGURE 1 shows a portion of an integrated circuit chip 10 of silicon having silicon dioxide layers 12 and 14 on the top surface thereof. A layer of aluminum 16 has also been provided to serve as an electrical contact for circuit components (not shown) formed in the body of the chip 10. If the solder mound to be formed is not to serve as an active electrical contact, but rather as a passive standoff device, the layer of aluminum would be omitted. A ball limiting land 18 has been formed over the aluminum layer and may comprise a gold, copper and chromium laminate, as shown in FIGURE 1. The well known methods which may be employed to produce the structure in FIGURE 1 form no part of the present invention, and thus will not be described herein.

In performing the method of this invention, referring now to FIGURE 2, a metal or other suitable mask material 20 having holes therein corresponding to and somewhat larger than the ball limiting lands is placed over the chip 10 as shown (for only one land) such that the holes of the mask are concentric to the lands. This leaves an annular surface area 22 of the chip immediately surrounding the land 18 exposed. A layer of solder 24, such as a lead-tin alloy is then evaporated through the mask hole using known techniques to completely cover the land 18 and surrounding area 22 to a predetermined depth. After the solder evaporation is completed the mask is removed and the chip is heated under flux or in a reducing atmosphere to prevent oxidation until the solder reaches a molten state. At is melts, is gradually de-wets the surface area of the chip and draws upon to the desired mound or bead configuration 26 on top of the land 18, as shown in FIGURE 3.

The height of the resulting solder mound is determined by the diameter of the land 18, the diameter of the hole in the mask, and the thickness of the evaporated layer of solder. In a typical example, a mound of 6 to 7 mils in height may be produced using the outlined method on a land having a diameter of 6.5 mils by evaporating solder to a depth of 1.5 to 2 mils through a mask hole 12 mils in diameter. The relationship between the mask hole diameters and the mound heights is illustrated more clearly in FIGURES 4*a* and 4*b*, where it may be seen that since the evaporated layer of solder 28 has a considerably greater diameter than layer 30, the solder mound 32 formed from layer 28 by the de-wetting action is substantially higher than the mound 34 formed from layer 30. Since the ball limiting lands on the surface of the circuit chip generally have the same dimensions, and also because it is convenient to evaporate the solder to a uniform depth in all of the holes in a chip mask, the most expeditious way of simultaneously forming solder mounds of different heights on the same chip is to vary the sizes of the mask holes in proportion to the desired heights of the mounds.

FIGURE 5 shows a circuit chip 10 assembled to a mounting board 36 provided with contact terminals 38. A pair of active electrical contacts 40, 42 have been formed on the chip to mate with the terminals 38 and a slightly larger mound 44 has been provided to serve as a passive standoff. If the assembly of FIGURE 5 is heated to re-melt the solder, the contacts 40 and 42 will flow together with their associated terminals 38 to form good electrical connections, while mound 44 will retain its original shape and maintain the proper spacing between the chip and the board. The standoff mound does not itself re-flow since it cannot wet the ceramic surface of the mounting board 36, and its molten surface tension causes it to remain in its original configuration.

While the invention has been particularly shown and described with reference to a preferred embodiment thereof, it will be understood by those skilled in the art that various changes in form and details may be made therein without departing from the spirit and scope of the invention.

What is claimed is:

1. A method for forming a solder mound on an inorganic electrically insulating substrate provided with a metallic, ball limiting land on a surface thereof, comprising the discrete steps of:

(a) masking the surface of the substrate so as to expose only the land and an area immediately surrounding it, (b) evaporating a layer of solder through the mask and onto the exposed land and surrounding area, (c) removing the mask, (d) heating the substrate above the melting point of the solder, whereby the molten solder will de-wet the surface area of the substrate surrounding the land and draw up to form the desired mound, and (e) allowing the substrate to cool below the melting point of the solder whereby the molten solder mound will solidify.

2. A method of forming a solder mound as defined in claim 1 wherein the land is circular and the unmasked area surrounding the land is a concentric annular ring.

3. A method of forming a solder mound as defined in claim 1 wherein the substrate is heated in a reducing atmosphere to prevent oxidation.

4. A method of forming a solder mound as defined in claim 1 wherein the substrate has provided thereon a solder flux to prevent oxidation.

5. A method of forming an electrical connection between an electrically insulating circuit chip provided with at least two ball limiting lands on the surface, and a substrate provided with at least one contact terminal, and maintaining a spaced standoff relation therebetween comprising the discrete steps of:

(a) forming at least two solder mounds on the circuit chip by, (1) masking the surface of the chip so as to expose only the lands and the areas immediately surrounding same, (2) evaporating a layer of solder through the mask and onto the exposed lands and surrounding areas, (3) removing the mask, and (4) heating the chip above the melting point of the solder, whereby the solder will de-wet the surface areas of the chip surrounding the lands and draw up to form mounds, (b) positioning said chip in overlying relation to said substrate with at least one of the solder mounds in contact with the contact terminal, and at least one of the remaining mounds in contact with the surface of said substrate, and (c) heating the resultant assembly to a temperature above the melting point of the solder.

6. A method of forming an electrical connection between an electrically insulating circuit chip provided with at least two ball limiting lands on the surface, and a substrate provided with at least one contact terminal, and maintaining a spaced standoff relation therebetween comprising the discrete steps of:

(a) forming at least two solder mounds on the circuit chip by, (1) masking the surface of the chip so as to expose only the lands, (2) evaporating a layer through the mask onto the exposed lands, (3) removing the mask, (b) positioning said chip in overlying relation to said substrate with at least one of the solder mounds in contact with the contact terminal, and at least one of the remaining mounds in contact with the surface of said substrate, and (c) heating the resultant assembly to a temperature above the melting point of the solder.

References Cited

UNITED STATES PATENTS

| | | | |
|---|---|---|---|
| 2,781,282 | 2/1957 | Morgan | 117—107 X |
| 3,235,959 | 2/1966 | Bartoszak | 29—498 |
| 3,261,713 | 7/1966 | Groten | 117—212 |
| 3,286,340 | 11/1966 | Kritzler | 29—471.1 |
| 3,292,240 | 12/1966 | McNutt | 29—504 X |
| 3,293,076 | 12/1966 | Allen | 117—107 X |
| 3,303,393 | 2/1967 | Hymes | 317—101 |
| 3,322,517 | 5/1967 | Miller | 29—197.5 |

OTHER REFERENCES

Bumps, and Balls, Pillars and Beams: A Survey of Face-Bonding Methods, by George Sideris, Electronics, June 28, 1965.

JOHN F. CAMPBELL, Primary Examiner

J. L. CLINE, Assistant Examiner

U.S. Cl. X.R.

29—590, 471, 473; 117—212, 213